(12) United States Patent
Thalhammer et al.

(10) Patent No.: US 7,199,683 B2
(45) Date of Patent: Apr. 3, 2007

(54) BAW RESONATOR

(75) Inventors: Robert Thalhammer, Munich (DE); Robert Aigner, Unterhaching (DE); Stephan Marksteiner, Neubiberg (DE)

(73) Assignee: Infineon Technologies AG, Munich (DE)

( * ) Notice: Subject to any disclaimer, the term of this patent is extended or adjusted under 35 U.S.C. 154(b) by 9 days.

(21) Appl. No.: 11/068,522

(22) Filed: Feb. 28, 2005

(65) Prior Publication Data

US 2006/0170519 A1  Aug. 3, 2006

(30) Foreign Application Priority Data

Jan. 31, 2005  (DE)  ............. 10 2005 004 435

(51) Int. Cl.
*H03H 9/00* (2006.01)
*H03H 9/54* (2006.01)
(52) U.S. Cl. .................... 333/187; 333/191
(58) Field of Classification Search ............... 333/187, 333/189, 190, 191, 192; 310/326
See application file for complete search history.

(56) References Cited

U.S. PATENT DOCUMENTS

| | | | |
|---|---|---|---|
| 6,424,237 B1 * | 7/2002 | Ruby et al. ............... 333/187 |
| 6,509,813 B2 * | 1/2003 | Ella et al. ................. 333/187 |
| 6,534,900 B2 * | 3/2003 | Aigner et al. ............ 310/326 |
| 6,774,746 B2 * | 8/2004 | Whatmore et al. ....... 333/189 |
| 6,842,088 B2 | 1/2005 | Yamada et al. |
| 6,975,183 B2 * | 12/2005 | Aigner et al. ............ 333/187 |
| 6,977,563 B2 * | 12/2005 | Komuro et al. .......... 333/187 |

OTHER PUBLICATIONS

Thalhammer et al., "Prediction of BAW Resonator Performance Using Experimental and Numerical Methods", 2004 IEE Ultrasonics Symposium, vol. 1, Aug. 2004, pp. 282-285, (4 pages).

* cited by examiner

*Primary Examiner*—Dean Takaoka
(74) *Attorney, Agent, or Firm*—Maginot, Moore & Beck

(57) ABSTRACT

A BAW resonator includes a resonator region having a piezo-electric layer between two excitation electrodes, wherein an acoustic standing wave forms when operating the BAW resonator at a resonant frequency. Furthermore, the BAW resonator includes a leaky wave reflection structure formed to reflect leaky waves generated when operating the BAW resonator, wherein the leaky waves propagate in a direction differing from a propagation direction of the acoustic standing wave.

23 Claims, 4 Drawing Sheets

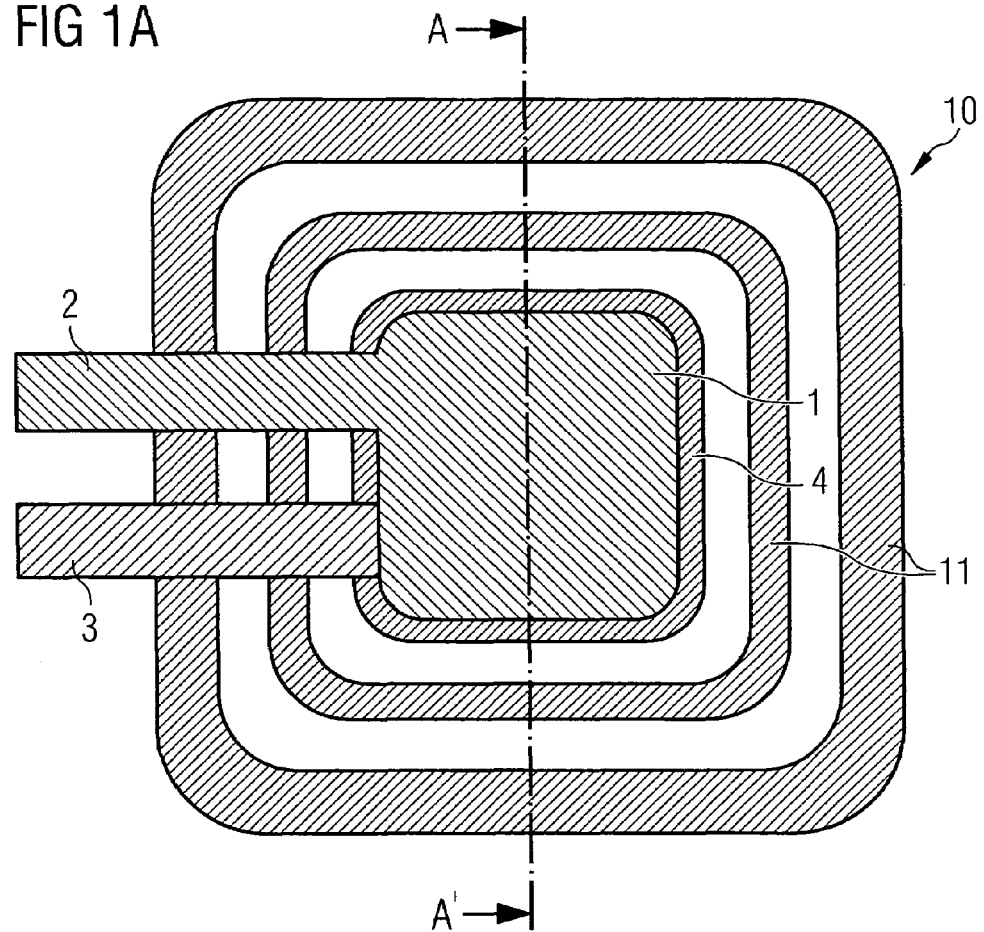
FIG 1A
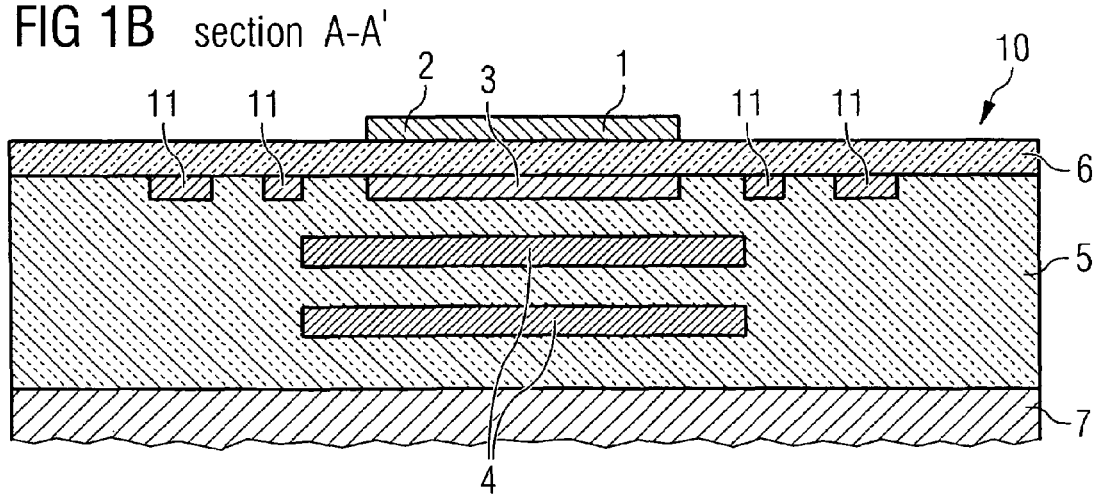
FIG 1B section A-A'

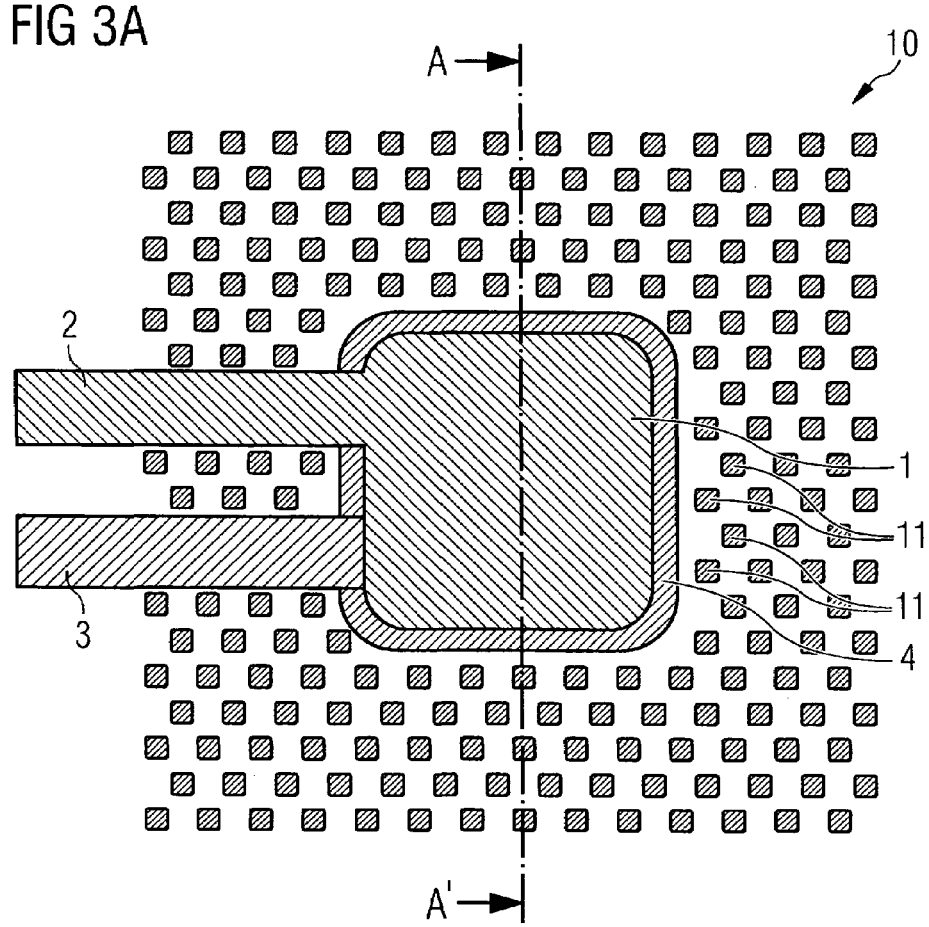
FIG 3A
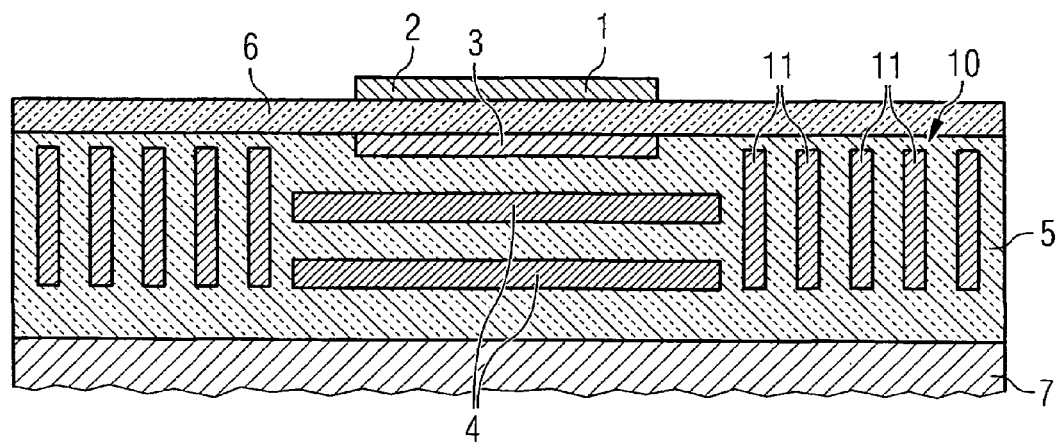
FIG 3B  section A-A'

— = Standard structure
---- = Structure having leahy ware reflection structure
— — = unit circle

BAW RESONATOR

CROSS-REFERENCE TO RELATED APPLICATION

This application claims priority from German Patent Application No. 102005004435.2 with the title "BAW-Resonator", which was filed on Jan. 31, 2005, and is incorporated herein by reference in its entirety.

BACKGROUND OF THE INVENTION

1. Field of the Invention

The present invention relates to the technical field of semiconductor electronics and the present invention particularly relates to the technical field of bulk acoustic wave resonators (BAW resonators).

2. Description of Related Art

Bulk acoustic wave resonators (BAW resonators) are often used in electronics as cheap and easily manufacturable resonator structures. An example of a BAW resonator is illustrated in greater detail in FIG. 4. Here, an active resonator region 1 having a top electrode 2 and a bottom electrode 3 between which a piezo-electric layer 6 is arranged is illustrated. The top electrode 2 and the bottom electrode 3 also serve as feeding or excitation electrodes to cause a mechanical oscillation in the piezo-electric layer 6 when operating the BAW resonator. Furthermore, the bottom electrode and a part of a main surface of the piezo-electric layer 6 contact an embedding layer 5 which is, for example, made of $SiO_2$. Put differently, the active resonator region 1 is thus arranged on the embedding layer 5. Additionally, one or several mirror layers 4 are arranged below the active resonator region 1 in the embedding layer 5, as is, for example, shown in FIG. 4 using the two mirror layers 4. Furthermore, the embedding layer 5 is arranged on a substrate 7.

When the active resonator region 1 is excited by applying a high-frequency voltage signal between the top electrode 2 and the bottom electrode 3, i.e. when the piezo-electric layer 6 is caused to oscillate mechanically by the voltage applied between the electrodes 2 and 3, a standing wave 8 will form in the BAW resonator between the active resonator region 1 in combination with the underlying mirror layers 4 buried in the embedding layer 5.

It is to be mentioned with regard to the BAW resonators that laterally propagating leaky waves 9 also occur when forming a standing wave 8 which transport energy from a region where the standing wave forms (i.e. the resonator region 1 with the underlying mirror layers 4) and thus decrease the quality of the BAW resonator. This is exemplarily illustrated in the Smith diagram illustrated in FIG. 5 where such a conventional standard structure, illustrated in FIG. 4, of a BAW resonator is identified by means of a continuous line. The decrease in quality of conventional BAW resonators can be recognized by a smaller radius of the corresponding characteristic curve in this Smith diagram, the characteristic curve being characterized by a greater distance to the unit circle (short-dashed line) in particular in the range of high impedances. This becomes particularly evident in the enlarged portion 52 of the Smith diagram 50. It is to be pointed out in general that the quality of a resonator will be the higher the closer its characteristic is to the unit circle. A considerable difference between a conventional standard structure and the unit circle can be recognized in particular in the area of a parallel resonance (high impedance, point at (1,0)).

In the theory of BAW resonators, it is assumed that an exponentially decreasing "evanescent" wave provides for a perfect lateral enclosure of the acoustic energy outside the electrode area. The evanescent wave condition is usually fulfilled in membrane BAW resonators since the surroundings of the resonator have a higher resonant frequency. In BAW resonators on acoustic mirrors, there is, however, a plurality of branches in a corresponding dispersion diagram and the enclosure of the acoustic energy will never be perfect. The loss of energy and the decreasing quality connected thereto have, up to now, been accepted.

SUMMARY OF THE INVENTION

It is an object of the present invention to provide a BAW resonator which, compared to a conventional BAW resonator, has an improved quality and which additionally can be manufactured easily and at low cost.

In accordance with a first aspect, the present invention provides a BAW resonator having: a resonator region having a piezo-electric layer between two excitation electrodes, wherein a standing wave forms when operating the BAW resonator at a resonant frequency; and a leaky wave reflection structure formed to reflect leaky waves generated when operating the BAW resonator, wherein the leaky waves propagate in a direction differing from a propagation direction of the acoustic standing wave.

The present invention is based on the finding that an increase in quality of a BAW resonator can be obtained when leaky waves propagating in a direction differing from the propagation direction of the acoustic standing wave can be reflected by a suitable leaky wave reflection structure and when thus no loss of energy occurs by an energy transport of the lateral leaky wave from the resonator region or the region between the resonator region and the mirror layers or when an energy transport from the resonator region is prevented as far as possible. This, in particular, results from the fact that, due to the mass of the leaky wave reflection structure, a change in the local oscillation behavior is caused in a material around the leaky wave reflection structure at the position of the leaky wave reflection structure, which results in the reflection of an acoustic/mechanical oscillation in the material surrounding the leaky wave reflection structure.

The advantage of the inventive BAW resonator is that, due to the leaky wave reflection structure, the energy of the acoustic standing wave can be "held together" in a defined region, and consequently there are no quality losses. Compared to conventional BAW resonators, the inventive BAW resonator thus has the advantage of an improved quality. Additionally, it is to be mentioned that a leaky wave reflection structure can also be produced easily and thus at low cost when processing or manufacturing the inventive BAW resonator, resulting in a cheap usage of the inventive BAW resonator even in mass production.

In a preferred embodiment of the BAW resonator, the resonator region additionally comprises a mirror region formed to reflect an acoustic wave, the mirror region being arranged in the resonator region such that an acoustic standing wave forms between the piezo-electric layer and the mirror region. Such a BAW resonator has the advantage of an optimized guidance of the acoustic standing wave compared to conventional BAW resonators having a membrane.

It is also of advantage for the leaky wave reflection structure to be formed in a BAW resonator to reflect leaky waves propagating in a direction essentially perpendicular to the propagation direction of the acoustic standing wave. This offers the advantage of a lateral reflection of a leaky wave when the acoustic standing wave has a vertical course.

In a favorable embodiment, the leaky wave reflection structure may also be arranged on a main surface of the piezo-electric layer, which makes possible a simple production of the leaky wave reflection structure.

The leaky wave reflection structure may also be arranged on the main surface of the piezo-electric layer facing the mirror region, which has advantageous effects for the reflection features of a leaky wave reflection structure arranged in this way.

Additionally, the leaky wave reflection structure may also be arranged on the main surface of the piezo-electric layer facing away from the mirror region, which has particularly advantageous effects when manufacturing such a leaky wave reflection structure.

It is also of advantage for one of the excitation electrodes and the leaky wave reflection structure to be made of the same material since in this case the leaky wave reflection structure and the corresponding excitation electrode can be produced in one process step.

The mirror region and the leaky wave reflection structure may also be buried in an embedding layer. This has particularly advantageous effects on a reflection of leaky waves in the embedding layer.

In another embodiment, the mirror region and the leaky wave reflection structure may also comprise the same material, which is favorable for a simple production of the leaky wave reflection structure in the same process step as the mirror region.

Furthermore, the leaky wave reflection structure may include a plurality of reflection structural elements, which is how a reflection factor or the frequency reflected of the leaky wave reflection structure can be adjusted precisely.

In addition, a width of the leaky wave reflection structure may be dependent on the resonant frequency, which also has the effect that the reflection factor and the frequency reflected of the leaky wave reflection structure can be adjusted favorably.

The distance of the leaky wave reflection structure and the resonator region may also depend on the resonant frequency. A special reflection factor or a special resonant frequency can, for example, be established by this. This dependence can be caused by a constructive or destructive interference forming due to the special relation of the distance between the leaky wave reflection structure and the resonator region and the resonant frequency, by means of which the reflection factor or, when selecting a certain distance, the corresponding resonant frequency can be adjusted.

Additionally, the distances between the reflection structural elements may be dependent on the resonant frequency, which also has positive effects on the adjustability of the reflection factor or the frequency reflected of the leaky wave reflection structure. As regards the dependence of the mutual distance of the reflection structural elements on the resonant frequency, constructive or destructive interferences formed, as have already been explained above, may be mentioned again.

It is also possible for a number of reflection structural elements to be dependent on a predefined reflection factor, which makes possible a suitable selection of the number and/or width of the individual reflection structural elements even when a defined reflection factor is predetermined.

In a favorable embodiment, the leaky wave reflection structure can also encircle the resonator region, wherein an opening for contacting one of the excitation electrodes can be formed in the ring-shaped leaky wave reflection structure. This makes possible a very favorable reflection characteristic of the leaky wave reflection structure since the energy oscillating in the resonator region can be enclosed nearly completely.

It is also possible for the leaky wave reflection structure to have a rod shape having a longitudinal axis which can be aligned basically perpendicularly to a plane defined by the piezo-electric layer. A depth action of the leaky wave reflection structure in the embedding layer can be achieved by this, wherein a high portion of leaky waves in the embedding layer can also be reflected in deeper regions.

Additionally, it is of advantage for a first reflection structural element to have a first minimum distance from the piezo-electric layer and a second reflection structural element to have a second minimum distance from the piezo-electric layer, wherein the first minimum distance differs from the second minimum distance. A matrix structure of the leaky wave reflection structure can be achieved here since the individual reflection structural elements are arranged in different depths from the piezo-electric layer and since, in addition to the reflection caused by the impedance change by the reflection structural elements, grating effects of such an arrangement of the reflection structural elements can be made use of, which can result in a reflectivity and/or in an improved angular characteristic.

The leaky wave reflection structure may also comprise a material having an acoustic impedance which is higher than the acoustic impedance of a material abutting on the leaky wave reflection structure. It is also possible here to utilize particularly advantageous characteristics by suitably selecting the materials for the leaky wave reflection structure, without having necessarily to fall back on materials for forming the mirror region or the excitation electrodes.

In particular, a plurality of reflection structural elements may also be arranged within a defined region of the BAW resonator, the reflection structural elements having basically equal distances to one another. This makes possible an optimized reflection characteristic since a periodic structure has very favorable characteristics with an equal distance of the individual elements at a predefined wavelength when this periodic distance is in a certain relation to the predefined wavelength.

BRIEF DESCRIPTION OF THE DRAWINGS

Favorable embodiments will be detailed subsequently referring to the appendage drawings, in which:

FIG. 1A is a top view illustration of a first embodiment of the inventive BAW resonator;

FIG. 1B is a cross-sectional illustration of the first embodiment of the inventive BAW resonator illustrated in FIG. 1A;

FIG. 3A is a top view illustration of a third embodiment of the inventive BAW resonator;

FIG. 3B is a cross-sectional illustration of the third embodiment of the inventive BAW resonator illustrated in FIG. 3A;

DESCRIPTION OF THE PREFERRED EMBODIMENTS

Figure 2:
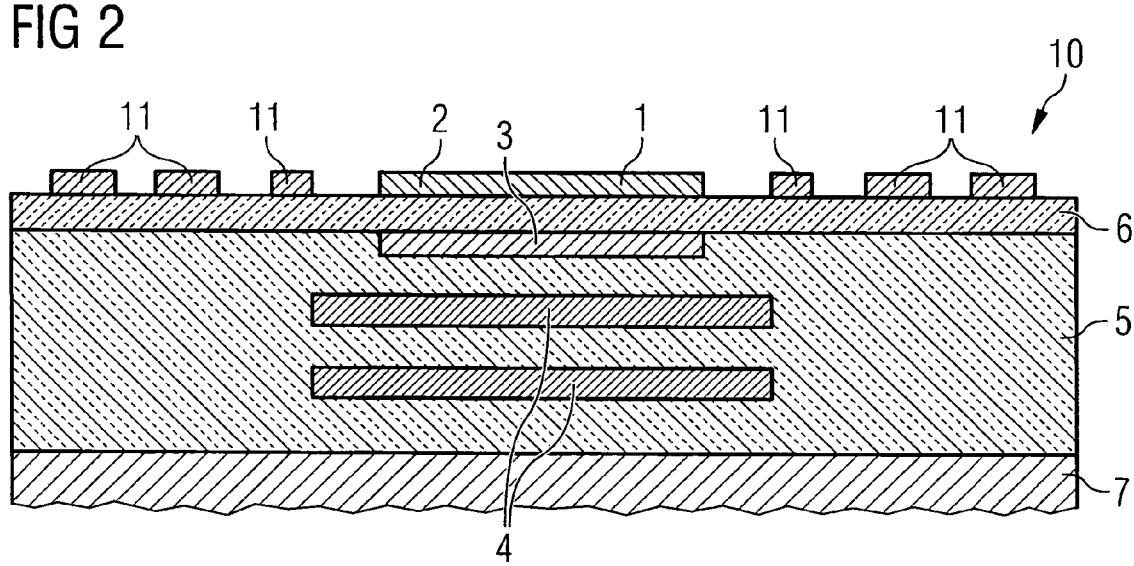
FIG. 2 is a cross-sectional illustration of a second embodiment of the inventive BAW resonator.

Equal or similar elements will be provided with equal or similar reference numerals in the appended drawings, wherein a repeated description of these elements will be omitted.

A first embodiment of the inventive BAW resonator is illustrated in FIG. 1A in a top view representation. Here, the BAW resonator illustrated in FIG. 1A includes an active resonator region 1 the top electrode 2 of which is arranged in the center of FIG. 1A. This top electrode 2 is arranged on a piezo-electric layer not illustrated in FIG. 1A for reasons of clarity, below which the bottom electrode 3 is arranged. In FIG. 1A, only the terminal contact of the bottom electrode 3 can be seen since in the embodiment shown the bottom electrode 3 itself is hidden by the top electrode 2. A narrow region of the mirror layer 4 arranged below the active resonator region 1 can be seen around the active resonator region 1. The material of the embedding layer is not illustrated in FIG. 1B for reasons of clarity.

As can be gathered from FIG. 1A, a leaky wave reflection structure 10 encircling that region where the acoustic standing wave forms when operating the BAW resonator is arranged around the active resonator region 1 and the mirror layer 4 buried below the active resonator region 1. It is, however, to be mentioned here that the leaky wave reflection structure 10 has an opening at one position to lead out the feeding of the bottom electrode 3. This opening, however, is not necessarily required for the feeding of the bottom electrode 3, but makes a production of such an embodiment of the inventive BAW resonator easier. This easy production particularly results from the fact that, when manufacturing such a leaky wave reflection structure 10, the leaky wave reflection structure 10 can be formed in one step with forming the bottom electrode 3 and thus an additional process step for forming the leaky wave reflection structure 10 can be avoided.

It can also be seen in FIG. 1A that the leaky wave reflection structure 10 may include several reflection structural elements, as are illustrated in FIG. 1A by the reflection structures 11 arranged concentrically and encircling the active resonator region 1. If the leaky wave reflection structure 10 is generated in one process step with the bottom electrode 3, the same material as for the bottom electrode 3 can preferably be used as the material of the leaky wave reflection structure 10, which is how the complexity of the production of such a leaky wave reflection structure 10 can be reduced to only a redesign of the corresponding processing masks. Furthermore, when using several reflection structural elements 11 separated from one another, the leaky wave frequency to be reflected by the leaky wave reflection structure 10 can also be influenced by selecting the width of these reflection structural elements 11 and/or by selecting the mutual distance of the reflection structural elements 11, which is how a special adjustment to the resonant frequency of the BAW resonator or possible harmonic oscillations of this resonant frequency can be performed independently.

Figure 4:
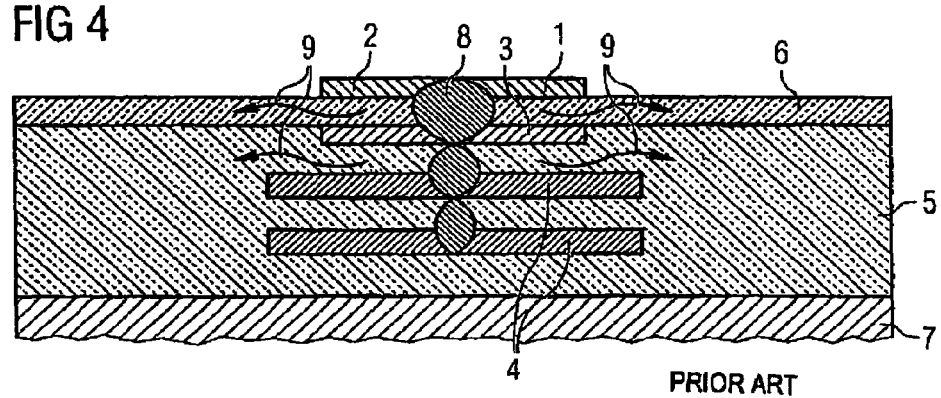
FIG. 4 is a cross-sectional illustration of a conventional BAW resonator.

A cross-sectional illustration of the first embodiment of the inventive BAW resonator illustrated in FIG. 1A is shown in FIG. 1B, wherein the cutting edge of the cross-sectional illustration represented in FIG. 1B is a cutting edge at the sectional line A–A' illustrated in FIG. 1A. As can be seen in FIG. 1B, the basic setup of the first embodiment of the inventive BAW resonator corresponds to the setup of the conventional BAW resonator illustrated in FIG. 4, except for the leaky wave reflection structure 10. In contrast to the conventional BAW resonator illustrated in FIG. 4, the BAW resonator illustrated in FIG. 1B includes the leaky wave reflection structure 10 having the two reflection structural elements 11 arranged next to each other. Here, the leaky wave reflection structure 10 is arranged at a first main surface of the piezo-electric layer 6, facing the mirror layers 4. Such an arrangement of the leaky wave reflection structure 10 has the advantage that both leaky waves in the piezo-electric layer 6 and leaky waves in the embedding layer 5 can be reflected effectively when operating such a BAW resonator by means of such an arrangement.

The leaky wave reflection structure 10 or the individual reflection structural elements 11 can be arranged on a main surface of the piezo-electric layer 6, facing away from the mirror layers 4, which is how a process step of etching corresponding recesses in the embedding layer 5 before forming the reflection structural elements 11 could be avoided (see FIG. 2). The arrangement of the leaky wave reflection structure 10 having the reflection structural elements 11 on the main surface of the piezo-electric layer 6 facing away from the mirror layers would, however, have lower reflection characteristics with regard to a leaky wave in the embedding layer 5. For some applications, however, where a compromise between cheap production and high quality must be made, a BAW resonator as is illustrated in FIG. 2 could be made use of.

A third embodiment of the inventive BAW resonator is illustrated in FIG. 3A in a top view illustration. Here, the leaky wave reflection structure 10 includes a plurality of reflection structural elements 11 arranged in a region around the active resonator region 1 and the underlying mirror layers 4. For reasons of clarity, an illustration of the piezo-electric layer 6 and of the embedding layer 5 is dispensed with in FIG. 3a, as is also the case in FIG. 1A. According to the third embodiment of the inventive BAW resonator, as is illustrated in FIG. 3a, the individual reflection structural elements 11 are formed as "points". Depending on in which layer or in which layers the reflection structural elements 11 are realized and depending on the thicknesses of the corresponding layers, rods which are basically oriented perpendicularly to the visual plane of FIG. 3A result in the cross-sectional profile. The arrangement of the individual reflection structural elements 11 in the BAW resonator is illustrated in greater detail in FIG. 3B. FIG. 3B in turn shows a cross-sectional illustration of the third embodiment of the inventive BAW resonator shown in FIG. 3a, wherein a cross-section profile at the sectional line A–A' is illustrated in the visual plane of FIG. 3B, corresponding to the sectional line A–A' characterized in FIG. 3A. Thus, it can be deduced from FIG. 3B that the leaky wave reflection structure 10 is composed of the individual reflection structural elements 11 embedded in the embedding layer 5. Here, a thickness or a distance of the individual reflection structural elements 11 can again be adjusted for setting a reflectivity or a frequency of a leaky wave to be reflected.

Figure 5:
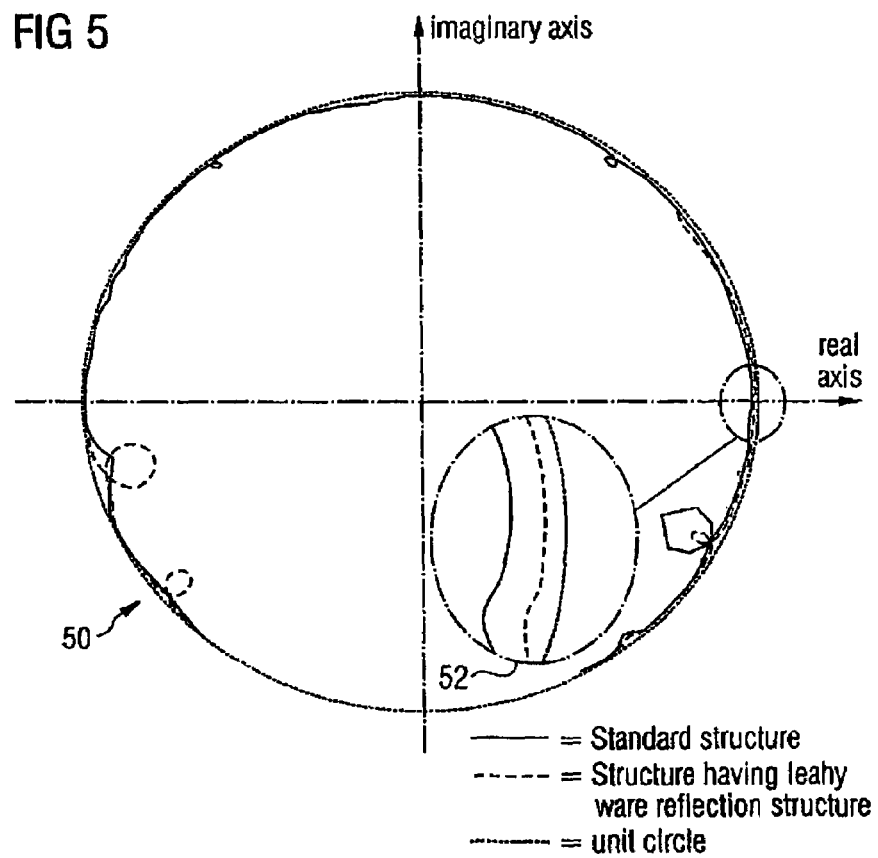
FIG. 5 is a Smith diagram including characteristic curves of the conventional BAW resonator and of the inventive BAW resonator according to the first embodiment.

It was proved by simulating the mode of operation of the leaky wave reflection structure 10 that an improvement in the quality of the BAW resonator can be achieved by using a leaky wave reflection structure. Apart from the simulated characteristic curve of a conventional BAW resonator structure, a simulated characteristic curve of a BAW resonator having a leaky wave reflection structure according to the first embodiment is also illustrated in FIG. 5 by a long-broken line. It can be seen particularly from the enlarged portion 52 that the BAW resonator having the leaky wave reflection structure has a characteristic curve having a shorter distance to the unit circle than the conventional standard structure of a BAW resonator. Thus, it can be deduced from FIG. 5 that a BAW resonator having a leaky wave reflection structure has an improved quality compared to a conventional BAW resonator.

In summary, it can be stated that in the embodiments of the present invention, edge structures which are based on acoustic bandgap structures of different kinds are suggested for an improved enclosure of energy in the resonator. Acoustic bandgaps are talked of in this relation when a solid body is formed such that the propagation of acoustic waves in a certain frequency domain is prevented. In equivalence to photonic bandgaps, they are usually structures made of different materials mostly arranged periodically in one or several dimensions. The material parameters of geometry and of the period of these structures determine the frequency domain (i.e. the "bandgap") in which a propagation of waves in the solid body can be prevented.

Consequently, it is suggested to mount suitable structures in one or several metal layers reflecting the laterally leaking (leaky) waves and thus improving the quality of the resonator, in the outer region of the resonator. This solution is compatible with the processing and does not require additional expenditure (except for the redesign of the corresponding mask levels).

In the additional edge structures, the dispersion relation is changed, and thus a jump in the acoustic impedance is generated, for example, by the higher mass of the metal compared to the oxide of, for example, the embedding layer. The result is a partial reflection at preferably both the inside and the outside of each reflector strip (i.e. each reflection structural element). With a suitable dimensioning as regards width and number of strips, an acoustic bandgap achieving a certain reflectivity in the desired wavelength region can be constructed by a constructive superposition of the partial reflections at the individual reflection structural elements. As can be seen from the simulated characteristics in the Smith diagram of FIG. 5, an improvement in quality can already be achieved by one ring or few rings, as are illustrated in FIG. 1A (and in analogy also in FIG. 2).

Different embodiments of the inventive BAW resonator are illustrated in greater detail in FIGS. 1A to 3B. In FIGS. 1A and 1B, a one-dimensional acoustic bandgap is realized by suitably structuring the bottom electrode 3, i.e. additional rings or strips arranged around the active resonator. Alternatively, the top electrode 2 can also be used, as is illustrated in greater detail in FIG. 2. When further trenches around the actual mirror trench are etched when etching the trench for the acoustic mirror (i.e. the mirror areas 4) (which does not require an additional process step), a one-dimensional acoustic bandgap, corresponding to FIG. 3B, is formed, for example by the subsequent deposition of wolfram and oxide and by the polishing steps. Different combinations with regard to the number and geometry of the reflection structural elements (in particular the number, width, distance and form, such as rings, points or strips, thereof) and with regard to the planes used (such as, for example, the mirror plane, the bottom electrode, the top electrode or several planes at the same time) are also conceivable for arranging the leaky wave reflection structure in the BAW resonator. Even non-periodic structures having different distances and/or widths are possible or conceivable in principle as reflections structures.

A two-dimensional acoustic bandgap can, for example, be obtained by using, instead of the encircling rings, as are illustrated in FIGS. 1 and 2, a periodic structure of rod-formed reflection structural elements at the edge of a resonance region between the active resonator region and the mirror layers, as is illustrated in FIGS. 3A and 3B. In analogy, it is also possible to use non-periodic (i.e. varying as regards distance and/or size) structures and/or to realize the structures of the reflection structural elements in different layers (such as, for example, in the top electrode, in the bottom electrode or in several layers). In this case, a two-dimensional acoustic bandgap has the particular characteristic that it reflects lateral leaky waves independently of the angle of incidence with regard to the resonator edge.

A three-dimensional reflection structure is also conceivable in principle. Such a three-dimensional acoustic bandgap structure would, for example, include cubes made of a material having a high acoustic impedance with regard to a surrounding material, wherein the cubes are, for example, embedded into a matrix made of a material having a low impedance and the cubes are preferably repeated periodically in the x, y and z directions. The manufacturing of a three-dimensional structure, however, entails greater expenditure compared to a two-dimensional structure. The individual cubes can also be arranged at different heights in the embedding layer and/or in different distances to the active resonator region (or the resonator region and the mirror region).

The preferred solution is illustrated in FIGS. 1A and 1B, where a structuring of the leaky wave reflection structure can be performed in the same process step in which the bottom electrode is structured. This variation cannot only be realized most easily but also promises the best performance from a theoretical point of view. This particularly results from the laterally leaking waves to be predominantly guided in the oxide of the embedding layer between the bottom electrode and one or several mirror layers, i.e. the structuring of the top electrode is less effective. In addition, a part of the waves in the oxide of the embedding layer is coupled into the overlying piezo-electric layer. An acoustic bandgap structure around the bottom electrode also acts on the waves in the piezo-electric layer and can thus reflect a greater portion of the energy which would otherwise be dissipated.

Outside the resonator the piezo-electric layer need not have the same thickness as in the resonator region. Furthermore, the electrodes may also have different sizes.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A BAW resonator comprising:
a resonator region having a piezo-electric layer between two excitation electrodes, wherein a standing wave forms when operating the BAW resonator at a resonant frequency; and
a leaky wave reflection structure operable to reflect leaky waves generated when operating the BAW resonator, wherein the leaky waves propagate in a direction differing from a propagation direction of the acoustic standing waves,
wherein the resonator region further comprises a mirror region formed to reflect an acoustic wave, wherein the mirror region is arranged in the resonator region such that an acoustic standing wave forms between the piezo-electric layer and the mirror region, and wherein the leaky wave reflection structure is arranged on a side of the piezo-electric layer facing the mirror region.

2. The BAW resonator of claim 1, wherein the mirror region is formed in an embedding layer and at least a portion of the piezo-electric layer adjacent to the embedding layer.

3. The BAW resonator according to claim 1, wherein the leaky wave reflection structure is formed to reflect leaky waves propagating substantially perpendicularly to the propagation direction of the standing wave.

4. The BAW resonator according to claim 1, wherein the leaky wave reflection structure is arranged on a main surface of the piezo-electric layer.

5. A BAW resonator comprising:
a resonator region having a piezo-electric layer between two excitation electrodes, wherein a standing wave forms when operating the BAW resonator at a resonant frequency; and
a leaky wave reflection structure operable to reflect leaky waves generated when operating the BAW resonator, wherein the leaky waves propagate in a direction differing from a propagation direction of the acoustic standing wave,
wherein the resonator region further comprises a mirror region formed to reflect an acoustic wave, wherein the mirror region is arranged in the resonator region such that an acoustic standing wave forms between the piezo-electric layer and the mirror region,
wherein the leaky wave reflection structure is arranged on a main surface of the piezo-electric layer facing the mirror region.

6. A method for operating a BAW resonator comprising a resonator region operable to generate a standing wave and a mirror region operable to reflect the standing wave, the standing wave propagating in a first propagation direction and leaky waves propagating in a second propagation direction different than the first propagation direction, the method comprising:
(a) providing a leaky wave reflection structure around the resonator region on a side of a piezo-electric layer facing the mirror region;
(b) generating the standing wave with the resonator region; and
(c) reducing the transport of energy from the resonator region when the standing wave is generated by reflecting the leaky waves with the leaky wave reflection structure.

7. The BAW resonator according to claim 1, wherein one of the excitation electrodes and the leaky wave reflection structure comprise a same material.

8. A BAW resonator comprising:
a resonator region having a piezo-electric layer between two excitation electrodes, wherein a standing wave forms when operating the BAW resonator at a resonant frequency; and
a leaky wave reflection structure operable to reflect leaky waves generated when operating the BAW resonator, wherein the leaky waves propagate in a direction differing from a propagation direction of the acoustic standing wave,
wherein the resonator region further comprises a mirror region formed to reflect an acoustic wave, wherein the mirror region is arranged in the resonator region such that an acoustic standing wave forms between the piezo-electric layer and the mirror region,
wherein the mirror region and the leaky wave reflection structure are buried in an embedding layer.

9. The BAW resonator according to claim 8, wherein the mirror region and the leaky wave reflection structure comprise a same material.

10. The BAW resonator according to claim 1, wherein the leaky wave reflection structure includes a plurality of reflection structural elements.

11. The BAW resonator according to claim 1, wherein a width of the leaky wave reflection structure depends on the resonant frequency.

12. The BAW resonator according to claim 1, wherein the distance of the leaky wave reflection structure from the resonator region depends on the resonant frequency.

13. The BAW resonator according to claim 10, wherein a distance between the plurality of reflection structural elements depends on the resonant frequency.

14. The BAW resonator according to claim 10, wherein a number of the plurality of reflection structural elements depends on a predefined reflection factor.

15. The BAW resonator according to claim 1, wherein the leaky wave reflection structure encircles the resonator region.

16. The BAW resonator according to claim 15, wherein an opening for contacting one of the excitation electrodes is formed in the leaky wave reflection structure.

17. The BAW resonator according to claim 8, wherein the leaky wave reflection structure has the shape of at least one rod having a longitudinal axis which is aligned substantially perpendicularly to a plane defined by the piezo-electric layer.

18. The BAW resonator according to claim 8, wherein the leaky wave reflection structure includes a plurality of reflection structural elements, and wherein a first reflection structural element comprises a first minimum distance to the piezo-electric layer and a second reflection structural element comprises a second minimum distance to the piezo-electric layer, the first minimum distance differing from the second minimum distance.

19. The BAW resonator according to claim 1, wherein the leaky wave reflection structure comprises a material having an acoustic impedance which is higher or lower than an acoustic impedance of a material abutting on the leaky wave reflection structure.

20. The BAW resonator according to claim 10, wherein the plurality of reflection structural elements are arranged within a defined region of the BAW resonator.

21. The BAW resonator according to claim 20, wherein the plurality of reflection structural elements have substantially equal distances to one another.

22. A resonator operable to form a standing wave which propagates in a first propagation direction and leaky waves which propagate in a second propagation direction different than the first propagation direction, the resonator comprising:
(a) a resonator region, wherein the standing wave forms in the resonator region, wherein the resonator region further comprises a mirror region operable to reflect the standing wave; and
(b) a leaky wave reflection structure for reflecting leaky waves propagating in the second propagation direction, the leaky wave reflection structure arranged around the resonator region and on a side of a piezo-electric layer facing the mirror region.

23. The BAW resonator of claim 8, wherein at least a portion of the piezo-electric layer abuts the embedding layer.

* * * * *